United States Patent [19]

Medal

[11] 3,831,102

[45] Aug. 20, 1974

[54] PUSH-PULL AUDIO AMPLIFIER

[75] Inventor: Richard J. Medal, Mount Prospect, Ill.

[73] Assignee: Rauland-Borg Corporation, Chicago, Ill.

[22] Filed: Mar. 9, 1973

[21] Appl. No.: 339,726

[52] U.S. Cl. .......................... 330/15, 307/300, 330/17

[51] Int. Cl. .................................... H03f 3/26

[58] Field of Search .......... 307/300; 330/13, 15, 17; 307/315

[56] References Cited

UNITED STATES PATENTS

| | | | |
|---|---|---|---|
| 3,406,351 | 9/1968 | Brouwer | 330/15 |
| 3,600,695 | 8/1971 | Krausser | 330/15 X |
| 3,629,725 | 12/1971 | Chun | 330/15 X |

OTHER PUBLICATIONS

D. E.–Norton "Turn–off Circuit," IBM Technical Disclosure Bulletin, Vol. 7, No. 6, p. 428, November 1964.

*Primary Examiner*—Herman Karl Saalbach
*Assistant Examiner*—Lawrence J. Dahl
*Attorney, Agent, or Firm*—Wolfe, Hubbard, Leydig, Voit, Osann, Ltd.

[57] ABSTRACT

A push-pull class B amplifier circuit having upper and lower legs each including transistors connected in Darlington pair configuration and feeding an output transformer. Each Darling pair is provided with an auxiliary transistor having its output connected, in shunting relation, to ground with the base of the output transistor thereof having its input controllably connected to a respective amplifier input terminal so that the auxiliary transistor forms an open circuit during conductive half cycles and forms a low resistance shunt connection for draining charge from the base of the output transistor to insure that there is no conduction in the latter whatsoever during inactive half cycles.

2 Claims, 3 Drawing Figures

PUSH-PULL AUDIO AMPLIFIER

In an amplifier circuit of the push-pull, class B type employing transistors connected as a Darlington pair in the upper and lower legs, it is found that conduction tends to persist from the active half cycle into the inactive half cycle. Such conduction produces a current in the output transformer which is in a direction opposite to that produced in the active side of the circuit, tending to degrade the characteristics of the amplifier. The persistance has been traced to the fact that the charge on the base of the output transistor, which exists during the conductive half cycle, cannot be dissipated immediately. Flow of such charge into the emitter extends conduction into the next, or inactive, half cycle. It has been proposed to dissipate this charge by providing a resistive path between the base of the second transistor and ground, the resistance being sufficiently high as to permit voltage swing at the base but sufficiently low as to provide a short time constant discharge path. One difficulty with such an arrangement is the large amount of signal power which must be wastefully dissipated in the resistor. Secondly, use of a discharge resistor has an adverse loading effect, to that extent jeopardizing and tending to shorten the life of the input section of the Darlington pair. Finally, use of a discharge resistor, not contemplated in the original Darlington circuit, affects the amplifier characteristics and tends to sacrifice the very improvement which the resistor is intended to bring about.

Accordingly, it is an object of the present invention to provide an improved class B amplifier employing a Darlington pair in the upper and lower legs which achieves clean cutoff of current flow during the inactive half cycle but which avoids any loading effect upon the Darlington pair and which does not affect the normal characteristics of the Darlington pair during the conductive half cycle.

It is a more specific object of the invention to provide an improved class B amplifier circuit which utilizes the desirable characteristics of a Darlington pair as an amplifying element but which avoids undesirable characteristics and which may be employed at a cost which is comparable to that of a conventional circuit without the improvement.

Other objects and advantages of the invention will become apparent upon reading the attached detailed description and upon reference to the drawing in which.

While the invention has been described in connection with a preferred embodiment, it will be understood that I do not intend to be limited to the embodiment shown but intend, on the contrary, to cover the various alternative and equivalent forms of the invention included within the spirit and scope of the appended claims.

Figure 1:
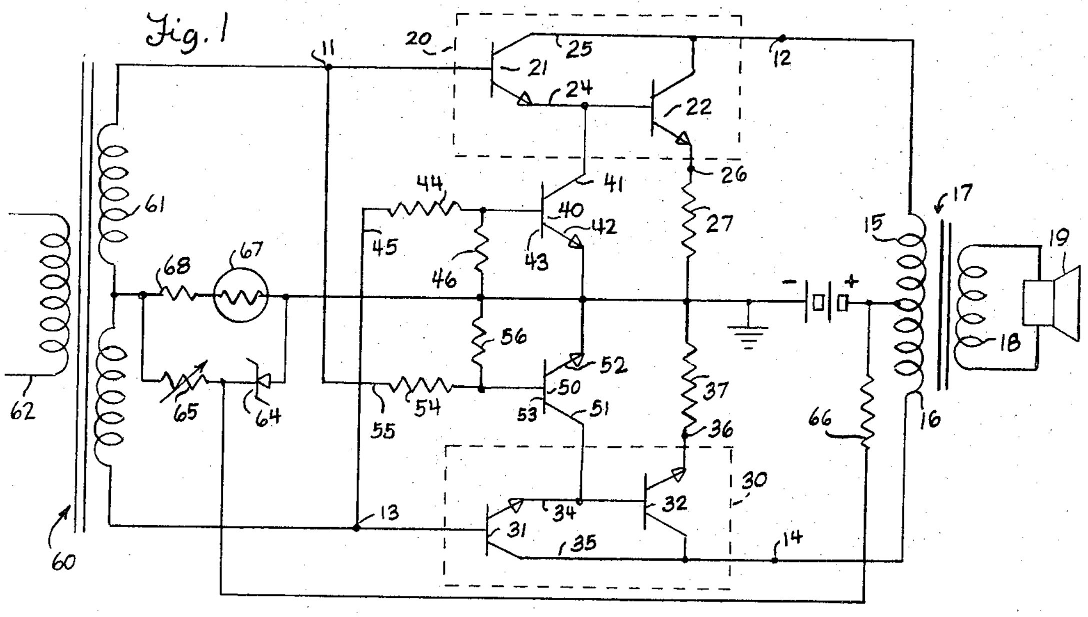
FIG. 1 is a schematic diagram of a class B amplifier circuit employing the present invention.

Turning now to the drawings, FIG. 1 shows a push-pull class B audio amplifier having an upper leg defined by an input terminal 11 and an output terminal 12 and a lower leg defined by an input terminal 13 and an output terminal 14. The output terminals feed sections 15, 16 of an output transformer 17. The secondary winding 18 of the transformer is connected to the voice coil of a loudspeaker 19.

Focusing upon the upper leg of the amplifier, it includes, as an amplifying element, a "Darlington pair" 20 made up of a first transistor 21 and a second transistor 22. The base of the first transistor is coupled to the input terminal 11.

Characteristic of a Darlington pair, the emitter of the first transistor has a connection, indicated at 24, with the base of the second transistor. The collectors of the two transistors are connected together, as indicated at 25, for feeding the output terminal 12, with the load circuit being completed through terminal 26 connected to the emitter. The emitter is connected to ground through an emitter resistor 27. A battery 28, or equivalent source of load current, is connected, as shown, from ground to the center tap of the output transformer primary winding.

The circuit of the lower leg of the amplifier is a mirror image of that set forth above. That is, a Darlington pair 20 is provided made up of transistors 31, 32 and internal connections 34, 35. The emitter terminal 36 is connected to ground by an emitter resistor 37.

In accordance with the present invention an auxiliary transistor is interposed between the base of the output transistor of each Darlington pair and ground, with the base, or input, connections of the auxiliary transistors being controllably coupled to respective amplifier input terminals so that the auxiliary transistors are open circuited during the conductive half cycle of the Darlington pair but provide a low resistance path to ground during the inactive half cycle for promptly draining charge from the associated Darlington pair to preclude any conduction thereof whatsoever during the inactive half cycle.

Thus referring to FIG. 1 an auxiliary transistor 40 is provided which, in the present instance, is of the NPN type, having an output circuit which includes a collector 41 and emitter 42, with the collector being connected to the base of the transistor 22 in the Darlington pair and the emitter being connected to ground. For the purpose of synchronizing conduction of the transistor with the inactive half cycles of the Darlington pair to which it is connected, while leaving the Darlington pair unaffected during the active half cycles, the control element or base 43 of the transistor is cross-connected, by a resistor 44 and line 45 to the lower input terminal 13. A base resistor 46 is connected to ground. Similarly, there is provided in the lower leg an auxiliary transistor 50 having a collector 51 connected, as shown, to the Darlington pair 30, an emitter 52 connected to ground, and a base 53 which is cross-connected, via resistor 54 and line 55, to the upper input terminal. The base, similarly, has a base resistor 56.

Prior to discussing the operation of the circuit mention may be made for the sake of completeness of typical input and biasing means. For applying an input signal of opposite phase to the input terminals 11, 13, and audio input transformer may be used, as indicated at 60, having a primary winding 62 and a pair of secondary windings 61, 63. For the purpose of biasing the Darlington transistors a biasing network is provided which includes a zener diode 64 having an adjustable resistor 65 and series resitor 66, the biasing means per se being conventional. For temperature compensation purposes a thyristor 67 is used having a series resistor 68 connected as shown, also conventional.

The operation of the circuit in precluding conduction of each Darlington pair during its inactive half cycle will be apparent upon considering the effect of a positive half cycle of voltage at the input terminal 11 and a negative half cycle of voltage at the input terminal 13. The effect of the positive half cycle in the upper leg of the circuit is to make the first transistor 21 conductive. Since the emitter current of the transistor 21 flows to the base of the transistor 22 in a direction to induce conduction, the transistor 22 causes a corresponding, amplified half wave of current to flow through the section 15 of the output transformer in the direction indicated by the arrow. Because of the negative voltage at the input terminal 13, transmitted to the auxiliary transistor 40 via line 45, the auxiliary transistor is effectively open circuited and has no effect whatsoever upon the Darlington pair 20 during the half cycle.

During the ensuing negative half cycle of voltage at the input terminal 11, the transistor 21 is turned off, thereby turning off transistor 22. However, there tends to be a residual positive charge left upon the base of the transistor 22 which, if allowed to persist, acts to prolong conduction in the transistor 22 causing conduction to "hang on" into the inactive half cycle. This effect is, however, precluded in the present circuit by reason of the auxiliary transistor 40. With the transistor 40 turned on, a low resistance path, with short time constant, is provided between the connection 24 in the Darlington pair and ground, thereby immediately draining or dissipating charge from the base of the transistor 22 so that conduction in the transistor is clipped off precisely at the end of the conductive half cycle.

Briefly stated, the high resistance of the auxiliary transistor during the conductive half cycle of the Darlington pair substantially isolates the latter to perform its intended function with a high degree of efficiency, while the extremely low resistance of the auxiliary transistor during the inactive half cycle clamps the pair into inactive state for the duration of the inactive half cycle.

While the operation during a typical half cycle has been discussed in connection with the upper leg of the circuit, it will be apparent that since the upper and lower legs of the circuit are mirror images of one another the operation of the lower portion of the circuit will be the same except reversed in phase, and with the auxiliary transistor 50 serving to promptly drain the residual charge.

Figure 2:
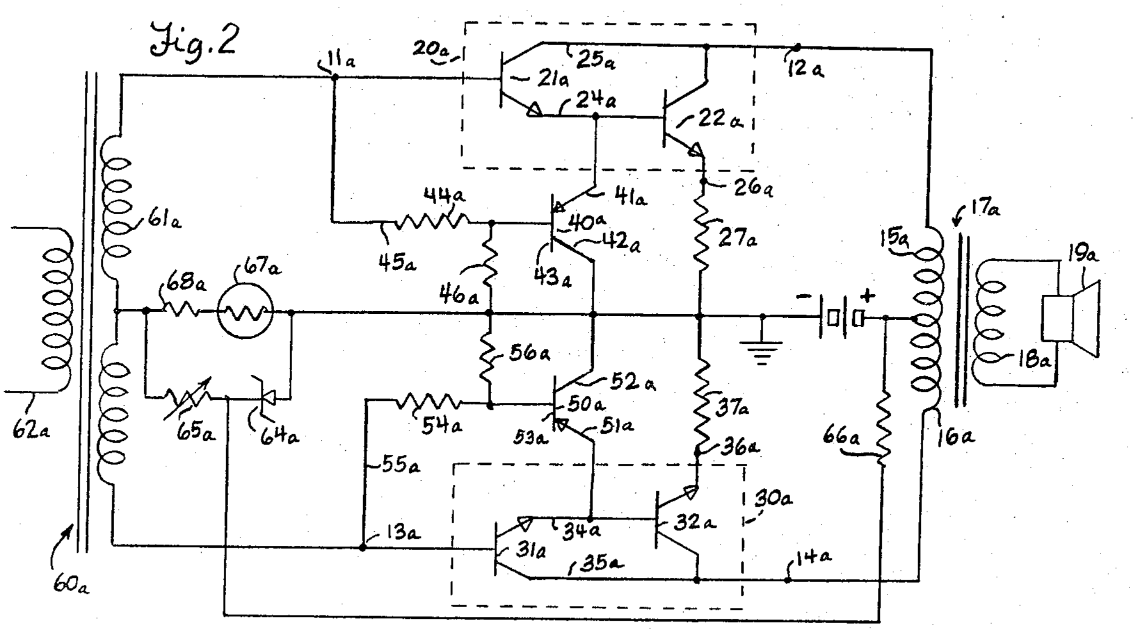
FIG. 2 shows a modified form of the circuit of FIG. 1 in which control for the auxiliary transistors is obtained from the same leg of the circuit.

And while the invention has been discussed in connection with use of NPN transistors having cross-connected inputs, it will be apparent to one skilled in the art that, if desired, the auxiliary transistors, indicated at 40*a*, 50*a* in FIG. 2, may be of the PNP type to receive a control signal from amplifier input terminals 11, 13 at the respectively same sides of the circuit. In operation, assuming a positive half wave of voltage at input terminal 11a, causing conduction in the upper Darlington pair 20*a*, positive voltage applied to the base of the input transistor causes such a transistor to be turned off. Conversely, a negative voltage applied to the input terminal 11*a*, resulting in non-conduction in the Darlington pair 20*a*, turns on the auxiliary transistor 40*a* to provide the desired low resistance leakage path to ground during the inactive half cycle.

Figure 3:
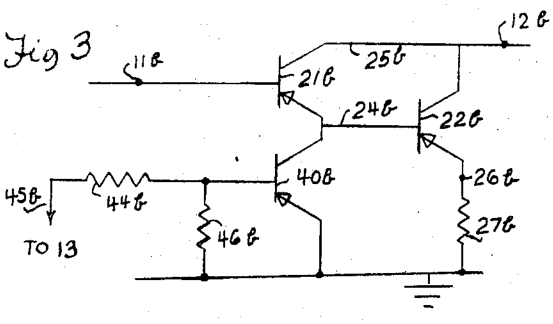
FIG. 3 shows how the circuit of FIG. 1 may be modified if desired to use transistors of the PNP type.

Also while the circuit has been described in connection with Darlington pair transistors of the NPN type, it will be apparent to one skilled in the art that the invention is not limited thereto. While PNP transistors are less common in Darlington usage, they may be employed as shown in FIG. 3 which is illustrative of the use of PNP transistors in the upper leg, similar elements being indicated by similar reference numerals with the addition of subscript *b*. Where PNP type transistors are used the polarity of the voltage supply 28 will, of course, be reversed.

The improvement in operation is brought about at negligible cost, particularly where the auxiliary transistor 40 is formed simultaneously with, and upon the same chip as, the transistors 21, 22.

What I claim is:

1. In a push-pull class B audio amplifier having upper and lower input terminals and upper and lower output terminals related to ground and defining upper and lower legs which are active during alternate half-cycles of an alternating input signal, the combination comprising first and second transistors in the upper leg connected in Darlington pair configuration in which (a) the base of the first transistor is connected to the input terminal, (b) the emitter of the first transistor is connected to the base of the second transistor, (c) the collectors are connected together to form a load circuit with the emitter of the second transistor, said upper leg including an auxiliary transistor having its output circuit connected in shunt between the base of the second transistor and ground, the lower leg arranged as the mirror image of the upper and including a Darlington pair and a similarly connected auxiliary transistor, a push-pull output transformer having its input windings connected to the respective Darlington load circuits, the input circuits of the auxiliary transistors being coupled to respective input terminals so that the auxiliary transistors are non-conducting during the conductive half-cycle of their associated Darlington pair but provide a low resistance path to ground during the inactive half-cycle thereof for promptly draining charge from the associated Darlington pair during the inactive half cycle to preclude any conduction thereof whatsoever during the inactive half-cycle.

2. The combination as claimed in claim 1 in which the input circuits of the auxiliary transistors are cross-connected to respective amplifier input terminals.

* * * * *